(12) United States Patent
Ohkubo

(10) Patent No.: US 7,929,113 B2
(45) Date of Patent: Apr. 19, 2011

(54) MEASUREMENT APPARATUS, MEASUREMENT METHOD, EXPOSURE APPARATUS, AND DEVICE MANUFACTURING METHOD

(75) Inventor: Akinori Ohkubo, Tucson, AZ (US)

(73) Assignee: Canon Kabushiki Kaisha, Tokyo (JP)

( * ) Notice: Subject to any disclaimer, the term of this patent is extended or adjusted under 35 U.S.C. 154(b) by 166 days.

(21) Appl. No.: 12/433,682

(22) Filed: Apr. 30, 2009

(65) Prior Publication Data

US 2009/0274963 A1    Nov. 5, 2009

(30) Foreign Application Priority Data

May 1, 2008    (JP) .................................. 2008-119672

(51) Int. Cl.
G03B 27/42    (2006.01)
G03B 27/54    (2006.01)
(52) U.S. Cl. .......................................... 355/53; 355/67
(58) Field of Classification Search .................. 355/52, 355/53, 55, 67–71; 356/399–401; 250/548
See application file for complete search history.

(56) References Cited

U.S. PATENT DOCUMENTS

| | | | |
|---|---|---|---|
| 5,841,520 A * | 11/1998 | Taniguchi | 355/53 |
| 6,771,350 B2 * | 8/2004 | Nishinaga | 355/53 |
| 7,528,966 B2 * | 5/2009 | Matsumoto | 356/614 |
| 7,791,718 B2 * | 9/2010 | Hagiwara | 356/124 |

OTHER PUBLICATIONS

W.N. Partlo, C.H. Fields, W.G. Oldham, Direct aerial image measurement as a method of testing high numerical aperture microlithographic lenses, J.Vac.Sci.Technol.B,vol. 11.

* cited by examiner

*Primary Examiner* — Hung Henry Nguyen
(74) *Attorney, Agent, or Firm* — Canon U.S.A., Inc., IP Division

(57) ABSTRACT

A measurement apparatus which illuminates a pattern positioned on an object plane to form an aerial image 40 on an image plane and measures a light intensity distribution of the aerial image 40 via a slit 54 on the image plane, the measurement apparatus including a stage 60 moving the slit, a light receiving element 53 mounted on the stage 60 and including at least two light receiving portions which receive the light transmitted through the slit, a storage unit which stores a relationship between an angle $\epsilon$ and a distance between a center position of the slit 54 and a position where a intensity of light that the light receiving element 53 receives is maximum, a calculation unit which obtains the angle $\epsilon$, and a stage driving unit 80 which rotates the stage 60 so that the angle $\epsilon$ is equal to zero.

10 Claims, 16 Drawing Sheets

ε = −3 d e g .

ε = 0 d e g .

ε = 3 d e g .

MEASUREMENT APPARATUS, MEASUREMENT METHOD, EXPOSURE APPARATUS, AND DEVICE MANUFACTURING METHOD

BACKGROUND OF THE INVENTION

1. Field of the Invention

The present invention relates to a measurement apparatus and a measurement method for measuring a light intensity distribution, an exposure apparatus including the measurement apparatus, and a device manufacturing method.

2. Description of the Related Art

Conventionally, in order to evaluate the performance of an optical system in a state where the optical system is installed in a semiconductor exposure apparatus, a mask pattern was exposed onto a wafer on which a resist is applied. This evaluation method needed to develop the resist after the exposure and to measure the resist image formed by the development using a SEM (Scanning Electron Microscope) or the like. Thus, since this evaluation method needs a plurality of processes such as a resist application, a development, and a measurement, a lot of time and cost are necessary per one evaluation.

Therefore, other than the above evaluation method, without performing an actual exposure, a method for imaging a mask pattern or a pattern for measurement in the air corresponding to a wafer plane and directly measuring the light intensity distribution by a measuring instrument (hereinafter referred to as an "aerial image measurement method") has been performed. As one example of this method, a slit scan method which scans a slit having a width narrower than a wavelength and measures light that has been transmitted through the slit by a light receiving element (For example, see "W. N. Partlo, C. H. Fields and W. G. Oldham, J. Vac. Sci. Technol. B, Vol. 11, pp. 2686-2691").

In the slit scan method, a slit formed on a light shielding film is used, and an aerial image having a periodic intensity distribution is formed by illuminating a line-and-space pattern (hereinafter referred to as an "L/S pattern") to form an image of this, for example. Partial light of the formed aerial image is transmitted through the slit, and the transmitted light that has been transmitted through the slit is irradiated on a light receiving element after being transmitted through a transmissive substrate which supports the light shielding film. The light that has been irradiated on the light receiving element is photo-electrically converted and is outputted as a slit signal.

A measurement sensor which is constituted by the light shielding film, the transmissive substrate, and the light receiving element is scanned at a stage in an X-axis direction, and the slit signal is monitored per a scan step. The aerial image is measured by scanning this slit and using the monitored signal (hereinafter referred to as a "slit scan signal").

However, in the conventional slit scan method, in the case where the period of the intensity distribution fluctuation of the aerial image is shortened, if a longitudinal direction of the slit differs from a direction parallel to the L/S pattern of the aerial image, the modulation degree of the slit scan signal is extremely reduced.

The aerial image is, for example, an L/S pattern which is formed in parallel to a Y-axis direction, and in this case, the light intensity distribution is modulated in an X-axis direction at a half period HP. A position difference is generated between the direction parallel to the L/S pattern of the aerial image and the longitudinal direction of the slit formed on the light shielding film in an XY plane by an angle θ in a rotational direction. Ideally, if the angle θ is equal to zero, a slit scan signal with high modulation degree can be obtained. However, actually, the angle θ is not equal to zero because of an alignment error or the like.

When the slit scan is performed in the circumstances, the modulation degree of the slit scan signal is reduced compared to that of the aerial image. Furthermore, when the slit is displaced up to such an angle that it strides across the L/S pattern period of the aerial image, the light intensity irradiated on the slit does not change even if the slit is scanned. Therefore, since there is substantially no modulation degree of the slit scan signal, the measurement is impossible. When the angle between the slit and the L/S pattern is defined as a critical angle θc, it is represented by expression 1.

$$\theta c = \arcsin(2HP/SL) \qquad (1)$$

In expression 1, SL is a length of a slit in a longitudinal direction (a slit length) and HP is a half period of the light intensity distribution fluctuation of an aerial image. If the angle between the slit and the L/S pattern is smaller than the critical angle θc, the light intensity irradiated on the slit is modulated by scanning the slit.

FIG. 21 shows a relationship between the critical angle θc and the slit length SL. In FIG. 21, a vertical axis indicates the critical angle θc, and a lateral axis indicates the slit length SL. As shown in FIG. 21, when the slit length SL is around 50 μm, the critical angle θc is around 14 mrad in the case where HP is 200 nm. However, when HP is 45 nm, the critical angle θc is reduced to around 2 mrad.

Thus, if HP is reduced, the critical angle θc is reduced and the latitude of the position displacement is lowered. Therefore, in order to obtain the slit scan signal with high modulation degree, such an alignment with high accuracy that makes the angle θ smaller than at least the critical angle θc is required.

Conventionally, for example, a method for scanning a slit while an angle of the slit is changed and adjusting an alignment so that the modulation degree of the scan signal is the highest has been used. However, this method needed a lot of alignment time and the alignment accuracy was reduced because the change of the modulation degree was reduced when the modulation degree was high to some extent.

BRIEF SUMMARY OF THE INVENTION

The present invention provides a measurement apparatus and a measurement method which can adjust a position relation of a slit and an aerial image with high velocity and high accuracy. Furthermore, the present invention provides an exposure apparatus including the measurement apparatus and a device manufacturing method using the exposure apparatus.

A measurement apparatus as one aspect of the present invention is a measurement apparatus configured to illuminate a pattern positioned on an object plane of an optical system to form an image of the pattern on an image plane of the optical system and measure a light intensity distribution of the image via a slit positioned on the image plane. The measurement apparatus includes a stage configured to move the slit, a light receiving element which is mounted on the stage and includes at least two light receiving portions which receive light that has been transmitted through the slit, a storage unit configured to store a relationship between an angle between a direction parallel to an interference pattern of the image and a longitudinal direction of the slit and a distance in the longitudinal direction of the slit between a center position of the slit and a position where an intensity of light that the light receiving element receives is maximum, a calculation unit configured to obtain the angle using detection result detected by the light receiving element and the relationship stored in the storage unit, and a stage driving unit configured to rotate the stage so that the angle is equal to zero, using the angle calculated by the calculation unit.

A measurement method as another aspect of the present invention is a measurement method for illuminating a pattern positioned on an object plane of an optical system to form an image of the pattern on an image plane of the optical system and measuring a light intensity distribution of the image via a slit positioned on the image plane. The measurement method includes a light receiving step of receiving light that has been transmitted through the slit by using a light receiving element including at least two light receiving portions which are mounted on a stage configured to move the slit, a calculation step of obtaining an angle using detection result detected by the light receiving element and a relationship between an angle between a direction parallel to an interference pattern of the image and a longitudinal direction of the slit and a distance in the longitudinal direction of the slit between a center position of the slit and a position where an intensity of light that the light receiving element receives is maximum, a stage driving step of rotating the stage so that the angle is equal to zero, using the angle calculated in the calculation step, and a measurement step of measuring the light intensity distribution of the image after rotating the stage so that the angle is equal to zero.

An exposure apparatus as another aspect of the present invention includes the measurement apparatus. The exposure apparatus exposes a pattern of a mask onto a substrate based on a measurement result of the measurement apparatus.

A device manufacturing method as another aspect of the present invention includes the steps of exposing a substrate using the exposure apparatus, and developing the exposed substrate.

Further features and aspects of the present invention will become apparent from the following description of exemplary embodiments with reference to the attached drawings.

DETAILED DESCRIPTION OF THE PREFERRED EMBODIMENTS

Figure 1:
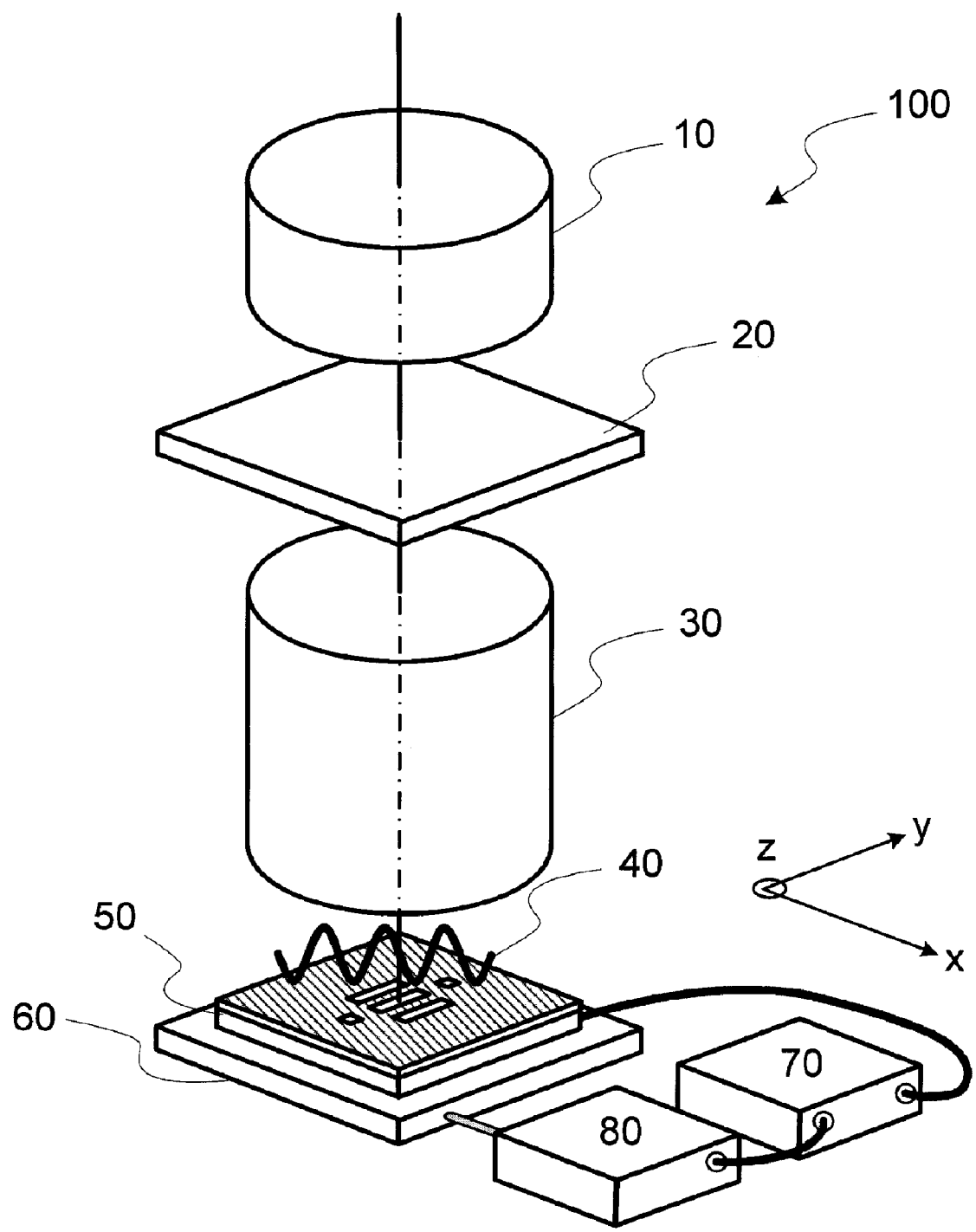
FIG. 1 is a schematic configuration diagram of a measurement apparatus in the present embodiment.

Exemplary embodiments of the present invention will be described below with reference to the accompanied drawings. In each of the drawings, the same elements will be denoted by the same reference numerals and the duplicate descriptions thereof will be omitted.

First, the schematic configuration of a measurement apparatus in the present embodiment will be described. FIG. 1 is a schematic configuration diagram of the measurement apparatus in the present embodiment.

In the measurement apparatus 100 of FIG. 1, reference numeral 10 is an illumination optical system. The illumination optical system 10, for example, refracts, reflects, and diffracts light from a light source (not shown) to irradiate the light on a mask 20. A pattern is formed on the mask 20 by a light shielding film such as chromium. Transmitted light and diffracted light dependent upon the pattern of the mask 20 are generated by irradiating the light on the mask 20 on which the pattern is formed.

The transmitted light and the diffracted light are irradiated on a projection optical system 30. The projection optical system 30 forms an image of the pattern of the mask 20 on an imaging plane. An aerial image 40 is formed on the imaging plane. The aerial image 40 is influenced by such all factors as the light source (not shown), the illumination optical system 10, the pattern of the mask 20, the projection optical system 30, a mechanism for holding these components, and a setting environment of the measurement apparatus 100.

Reference numeral 50 denotes a sensor. The sensor 50 is mounted on a stage 60 which is placed on an image plane of an optical system. The stage 60 is driven in an X-axis direction and a Y-axis direction and is rotationally driven around a Z-axis by a stage driving unit 80. Therefore, the sensor 50 mounted on the stage 60 is configured to be rotatable around the Z-axis using the stage driving unit 80.

The sensor 50 is provided with a light receiving element which receives light which has been transmitted through a slit. The sensor 50 receives the aerial image 40 formed on the imaging plane by the light receiving element via the slit. The aerial image 40 received by the light receiving element is converted to an electric signal by a photoelectric conversion and the electric signal is outputted to a signal processing unit 70.

The signal processing unit 70 processes a signal from the slit of the sensor 50 and a signal from an alignment opening to output a control signal in accordance with these signals to the stage driving unit 80. The signal processing unit 70 includes a storage unit which has previously stored the relationship between a direction of the slit and a light intensity received by the light receiving element and a calculation unit which calculates the direction of the slit for an alignment process described later.

The stage driving unit 80 outputs a drive signal to the stage 60 based on the control signal from the signal processing unit 70 in order to drive the stage 60 in X and Y directions. The stage driving unit 80 can rotate the stage 60 around the Z-axis based on the control signal from the signal processing unit 70.

Next, the sensor 50 will be described in detail.

Figure 2:
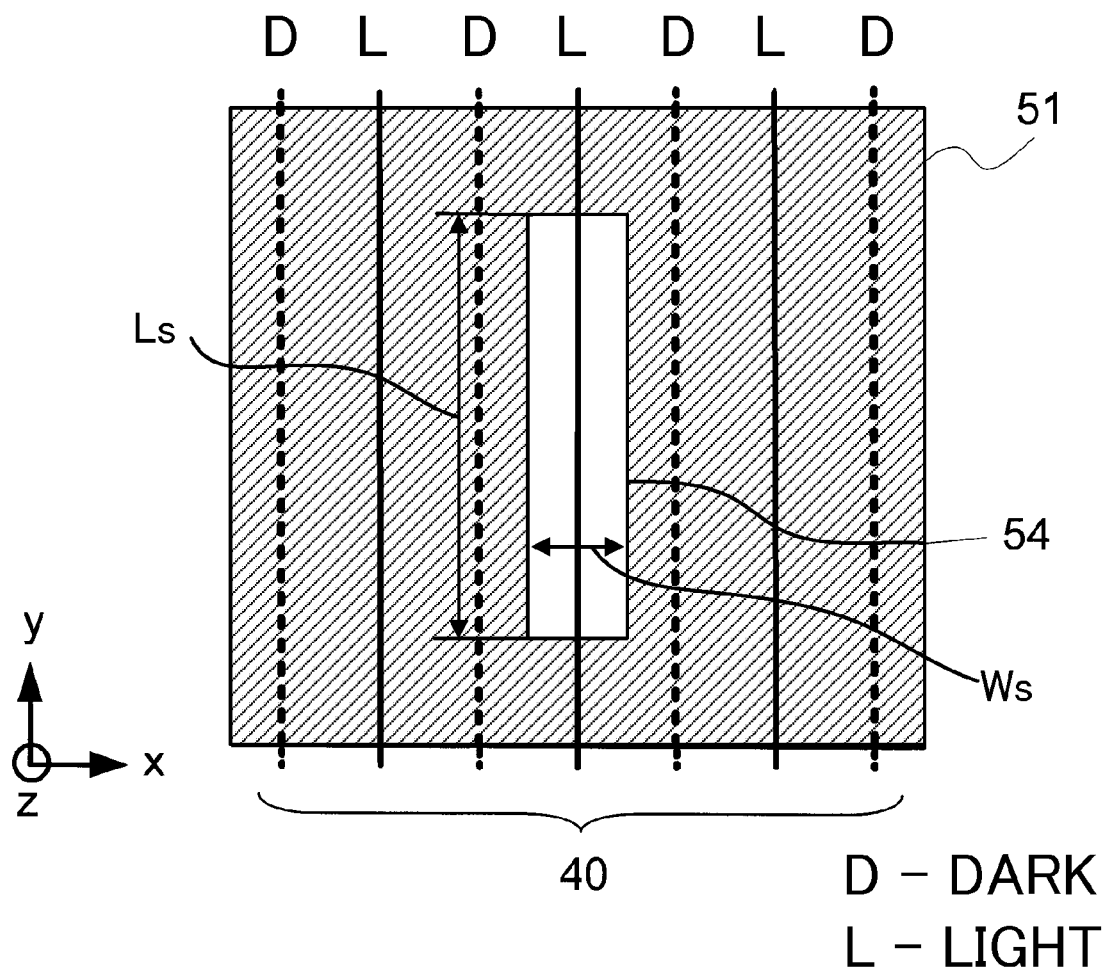
FIG. 2 is a top view of a sensor in the present embodiment.

FIG. 2 is a top view of the sensor 50 in the present embodiment. A light shielding film 51 is attached to the sensor 50. A slit 54 having a rectangle shape is formed in the light shielding film 51. When the width of the slit 54 in a lateral direction (an X-axis direction) is defined as Ws, in order to measure the aerial image with high accuracy for obtaining the resolution of the size equal to or less than a wavelength, the width Ws of the slit 54 needs to be set to satisfy expression 2.

$$Ws \leq \lambda \quad (2)$$

Here, $\lambda$ is a wavelength of the light source.

In FIG. 2, when the length of the slit 54 in a longitudinal direction (a Y-axis direction) is defined as Ls, the length Ls of the slit 54 is set to satisfy expression 3.

$$Ls \geq 10 \times \lambda \quad (3)$$

Thus, if the length Ls of the slit 54 is set to the value longer than the wavelength $\lambda$, the effect that the light transmitted through the slit 54 is diffracted in the longitudinal direction of the slit 54 is lower than the effect that the light is diffracted in the lateral direction. Therefore, a spread angle of the light from the slit 54 in the longitudinal direction is narrower than that in the lateral direction.

In the present embodiment, while the slit 54 is scanned, the light spread from the slit 54 is photo-electrically converted by a plurality of light receiving portions and slit scan signals in the plurality of light receiving portions are measured. An alignment signal of the slit 54 and the aerial image 40 in which light (L) and dark (D) alternately appears can be calculated using the phase difference of the plurality of slit scan signals.

Figure 3:
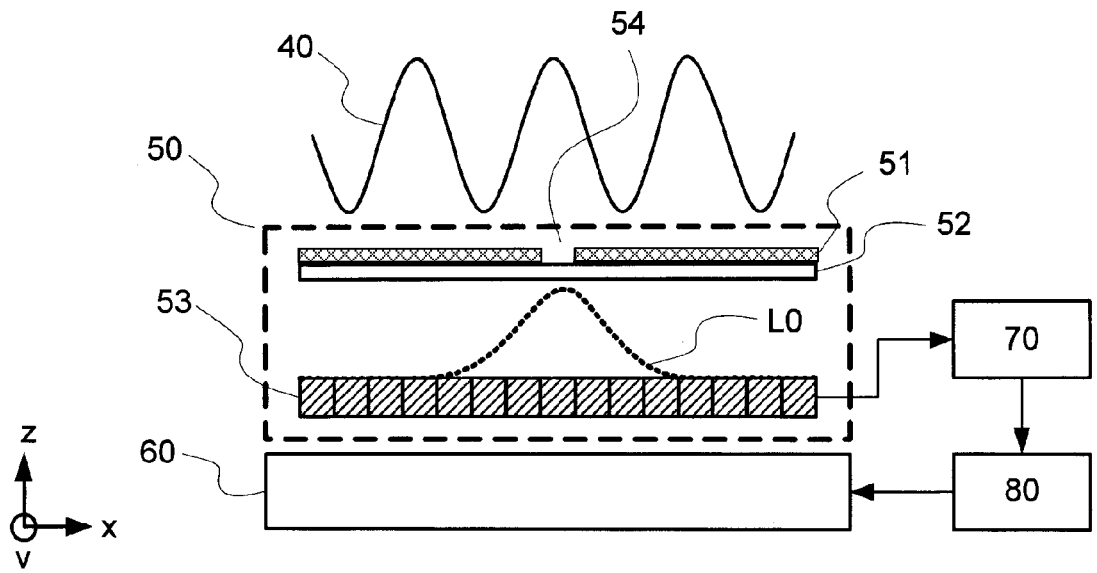
FIG. 3 is a cross-sectional view of a sensor in a lateral direction (X-axis direction) of a slit.

Next, the alignment which is used for the measurement method in the present embodiment will be described. FIG. 3 is a cross-sectional view of the sensor 50 in the longitudinal direction (the X-axis direction) of the slit 54. In the embodiment, it is considered that the aerial image 40 is formed by two-beam interference.

The light shielding film 51 shielding light is formed on a transmissive substrate 52 which transmits the light. The aerial image 40 is irradiated on a light receiving element 53 (a photoelectric conversion unit) after it has been transmitted through the slit 54. The light receiving element 53 of the present embodiment is separated into two-dimensional arrays and has a plurality of light receiving portions. An output signal from the light receiving element 53 is inputted to the signal processing unit 70 and is stored in a memory (not shown). After that, the sensor 50 moves a distance corresponding to a spatial frequency which has at least twice as high as that of the aerial image 40 in the X-axis direction by the stage driving unit 80 so as to meet the sampling theorem. Repeating this operation, the light intensity distribution in the X-axis direction can be measured. In the present embodiment, repeating this operation is referred to as a slit scan measurement. However, when the longitudinal direction of the slit 54 is not parallel to a direction of a pattern of the aerial image 40 in measuring the light intensity distribution in the X-axis direction, the modulation degree of the slit scan measurement signal is lowered. Therefore, in the present embodiment, the position relation between the slit 54 and the aerial image 40 is adjusted before the light intensity distribution is measured.

Figure 4:
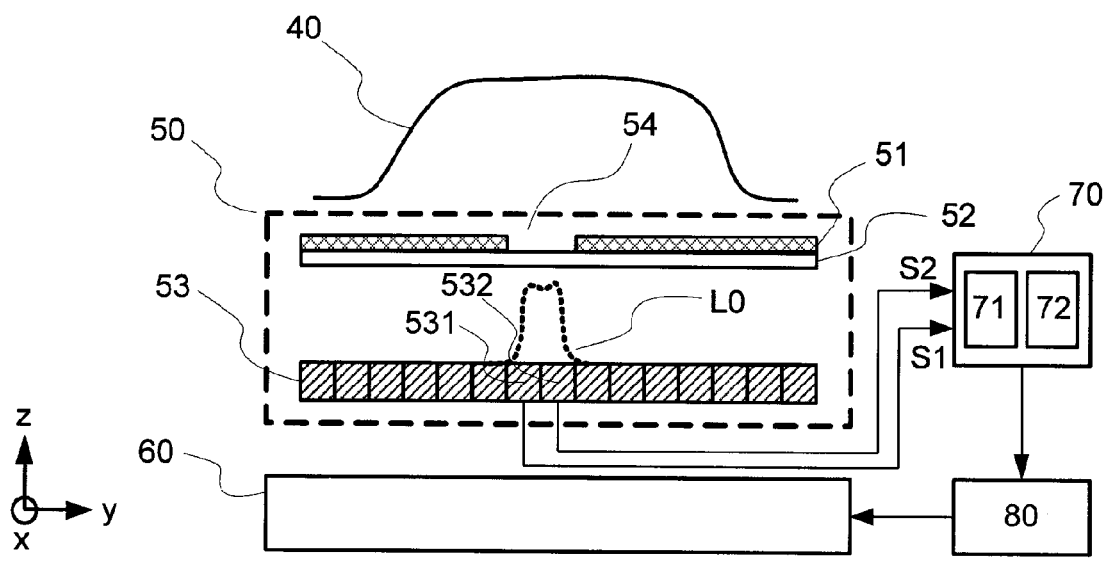
FIG. 4 is a cross-sectional view of a sensor in a longitudinal direction (Y-axis direction) of a slit.

FIG. 4 is a cross-sectional view of the sensor 50 in the longitudinal direction (the Y-axis direction) of the slit 54. The light transmitted through the slit 54 is irradiated on the plurality of light receiving portions (the light receiving element 53) which are separated into two-dimensional arrays. A signal S1 outputted from the light receiving element 53 is a signal that is photo-electrically converted in a first light receiving portion 531 constituting apart of the light receiving element 53. Similarly, a signal S2 is a signal that is photo-electrically converted in a second light receiving portion 532 constituting a part of the light receiving element 53. The signals S1 and S2 are inputted to the signal processing unit 70. The signal processing unit 70 includes a storage unit 71 and a calculation unit 72. The stage 60 is driven around the Z-axis by the signal outputted from the signal processing unit 70 to the stage driving unit 80, and the position relation between the slit 54 and the aerial image 40 is adjusted.

The positions of the first light receiving portion 531 and the second light receiving portion 532 differ from each other in the Y-axis direction. The light receiving element 53 of the present embodiment has only to include at least two light receiving portions, and may include three or more light receiving portions.

Figure 5:
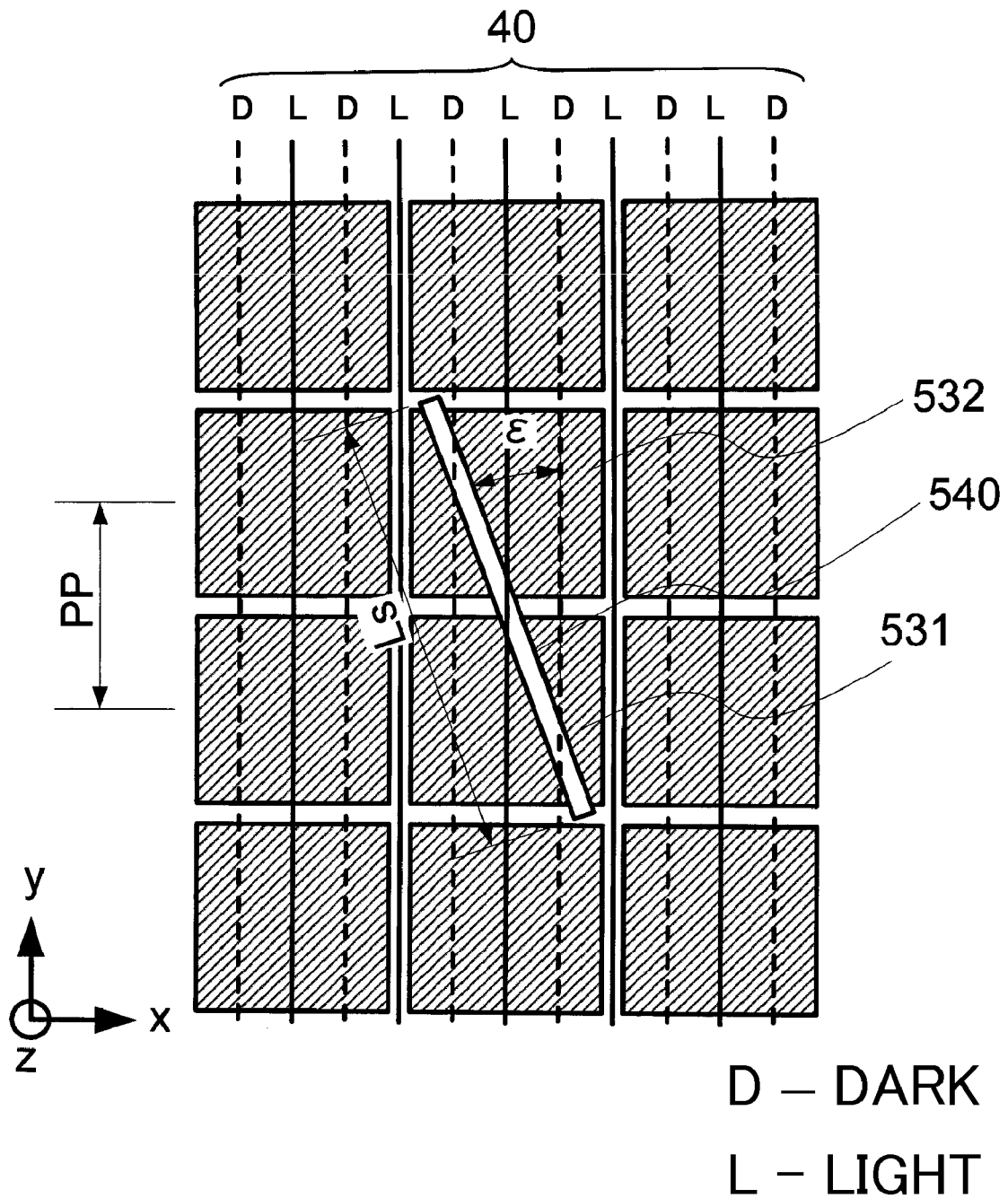
FIG. 5 is a top view of a sensor showing a position relation of a slit, a light receiving element, and an aerial image in the present embodiment.

FIG. 5 is a top view of the sensor 50 in the present embodiment. FIG. 5 shows a relative position relation of a slit 540, a plurality of light receiving portions which are arranged in two-dimensional arrays (a first light receiving portion 531 and a second light receiving portion 532), and an aerial image 40.

The sensor of the present embodiment is provided with a slit 540 that has a length of Ls in a longitudinal direction. A plurality of light receiving portions like two-dimensional arrays (a first light receiving portion 531 and a second light receiving portion 532) are arranged at positions distant from one another by a pitch PP. Light that has been transmitted through the slit 540 is photo-electrically converted by the first light receiving portion 531 and the second light receiving portion 532 which output signals S1 and S2, respectively. As shown in FIG. 5, the longitudinal direction of the slit 540 differs from a direction of an interference pattern of the aerial image 40 (a Y-axis direction) by an angle $\epsilon$.

In this case, for example, light that has been transmitted through the slit 540 with regard to the aerial image 40 (the interference pattern) of the two-beam interference forms a light intensity distribution like a hyperbolic curve on the light receiving element (the plurality of light receiving portions) by a conical diffraction of the slit 540.

Figure 6:
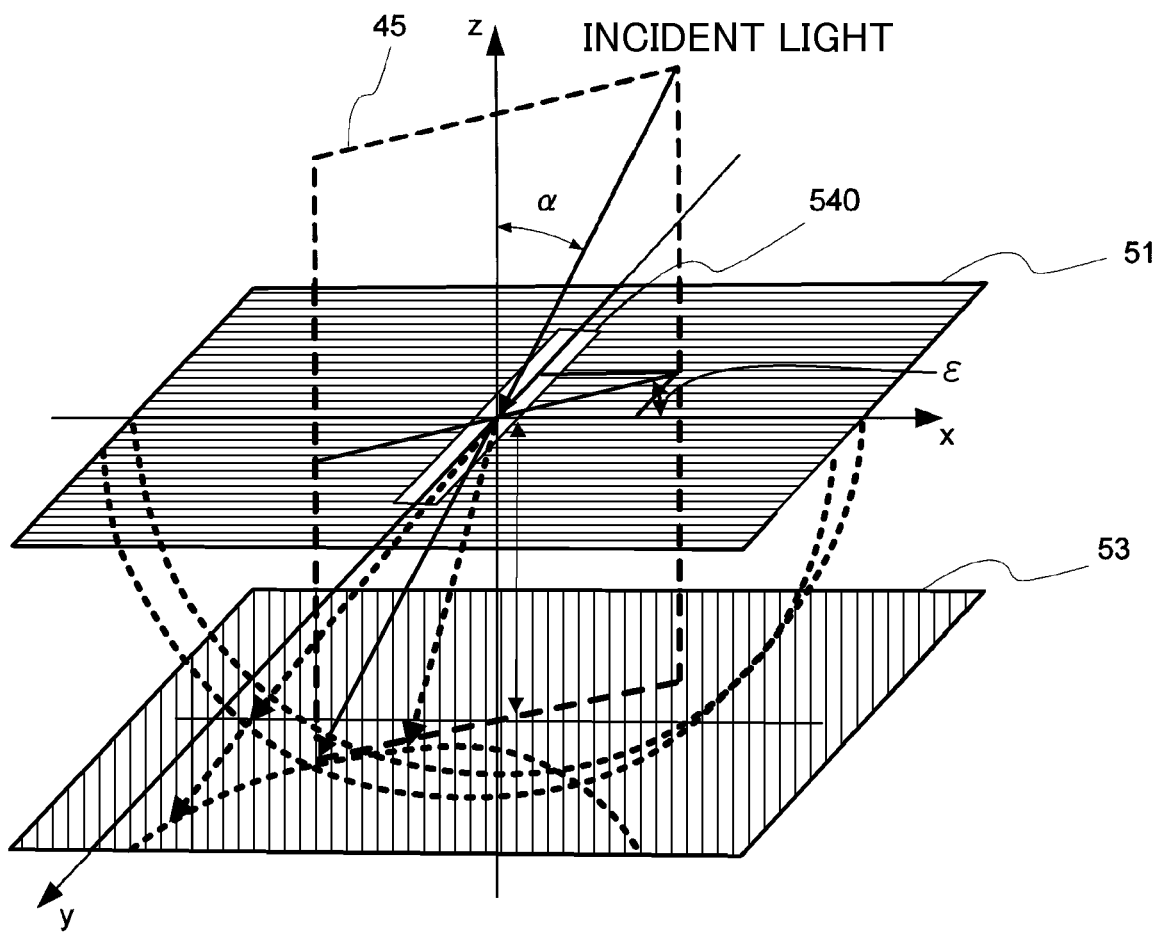
FIG. 6 is a view showing a transmitted light of a slit in the present embodiment.

In the embodiment, it is considered that an incident angle of the two light beams is $\pm\alpha$ for a Z-axis and that one of the light beams enters the light receiving element. FIG. 6 is a view showing transmitted light of the slit 540 in the present embodiment. The slit 540 shown in FIG. 6 is arranged so that the longitudinal direction of the slit 540 is parallel to the Y-axis direction, which is different from the case of FIG. 5. In this case, the angle $\epsilon$ is represented by an angle which is formed by the line of intersection between an incident plane 45 of the incident light and an XY plane and the X-axis. In the incident plane 45, when the incident light enters the slit 540 at an angle α for the Z-axis, the diffracted light from the slit 540 which is formed on the light shielding film 51 is distributed like a hyperbolic curve on the light receiving element 53 as represented by expression 4.

$$y = \frac{\sin\alpha \sin\varepsilon}{\sqrt{1 - \sin\alpha \sin\varepsilon}} \sqrt{x^2 + d^2} \tag{4}$$

The angle ε between the direction parallel to the interference pattern of the aerial image 40 and the longitudinal direction of the slit 540 shown in FIG. 5 corresponds to the angle ε of expression 4 by matching the Y-axis and the longitudinal direction of the slit 540. Thus, when the angle ε is not equal to zero, i.e. the slit 540 is not arranged vertically to the incident direction of the light, the position relation between the interference pattern of the aerial image 40 and the slit 540 are not parallel.

Figure 7:
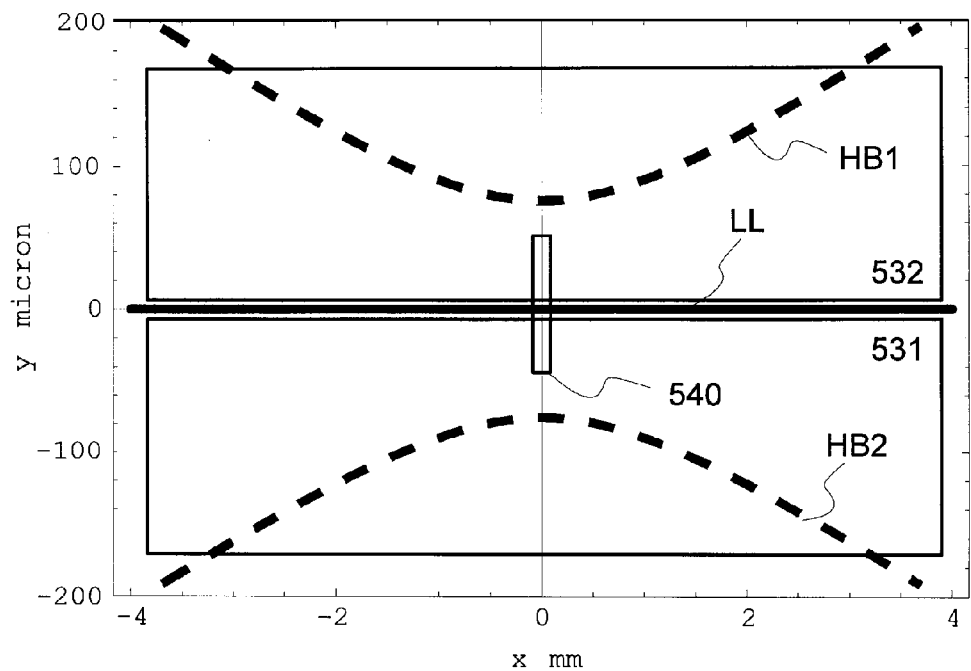
FIG. 7 is a top view of a sensor showing one example of a light intensity distribution in the present embodiment.

FIG. 7 is a top view of the sensor 50 in the present embodiment. One example of the light intensity distribution on the light receiving element (the first light receiving portion 531 and the second light receiving portion 532) is shown in FIG. 7.

In the case where the longitudinal direction of the slit 540 is not parallel to the direction of the interference pattern of the aerial image 40, i.e. in the case where the angle ε is formed, the light intensity on the light receiving element 53 is concentrated on a hyperbolic curve HB1 indicated by a dashed line shown in FIG. 7. When the angle ε is reduced to be close to zero, the light is concentrated on a straight line (a solid straight line LL) which is vertical to the longitudinal direction of the slit 540 on the light receiving element 53. Furthermore, when the angle ε is changed so as to be distant in an opposite direction beyond zero, the light is concentrated on the hyperbolic curve HB2 opposite to the hyperbolic curve HB1 with respect to the X-axis.

As shown in FIG. 7, the slit 540 is arranged in parallel to the Y-axis. The second light receiving portion 532 is arranged at a position of Y>0 and the first light receiving portion 531 is arranged at a position of Y<0. The signal outputted from the first light receiving portion 531 is defined as S1 and the signal outputted from the second light receiving portion 532 is defined as S2. In the case, when the incident angle (angle ε) of the light with respect to the slit 540 is changed, each of the signals S1 and S2 is changed because the position of the light is changed on a plane of the light receiving element 53.

Figure 8:
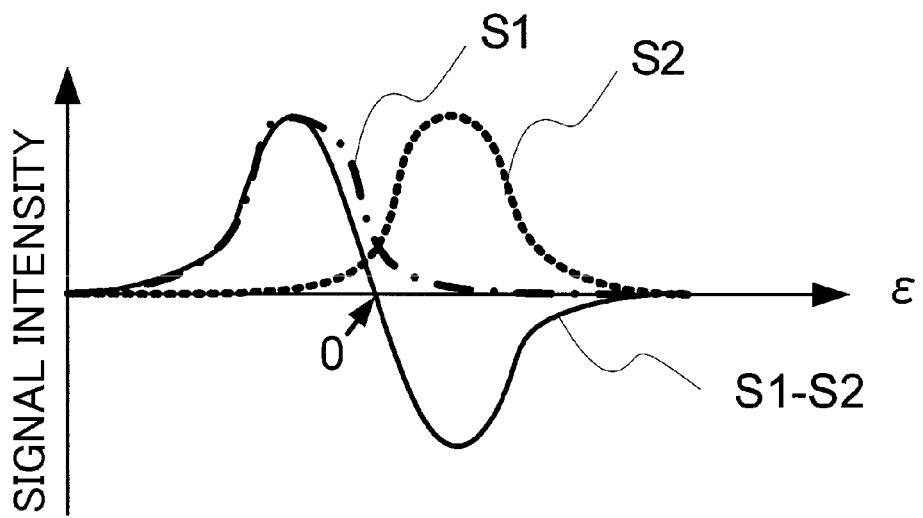
FIG. 8 is a relationship diagram between a signal intensity of a sensor signal (S1, S2, or S1−S2) and an angle $\epsilon$.

FIG. 8 is a characteristic diagram showing a relationship between a signal intensity of a sensor signal and an angle ε. The curved line indicated by a dashed-dotted line shows the signal intensity of the signal S1, and the curved line indicated by a dotted line shows the signal intensity of the signal S2. When S1−S2 which is obtained by subtracting the signal S2 from the signal S1 is monitored, an S-shaped curved signal as indicated by a solid line is obtained. A zero-cross point of the S-shaped curved signal S1−S2 is in a state where the angle ε is equal to zero, i.e. the longitudinal direction of the slit 540 is arranged vertically to the incident plane 45 of the incident light.

Therefore, based on the S-shaped curved signal S1−S2, it can be detected how far the incident plane 45 of the light is distant from a direction vertical to the longitudinal direction of the slit 540, i.e. the angle ε. Furthermore, the slit can be arranged so that the longitudinal direction of the slit is vertical to the incident plane of the light by controlling the slit or the incident direction of the light so that the S-shaped curved signal S1−S2 is equal to zero.

Figure 9:
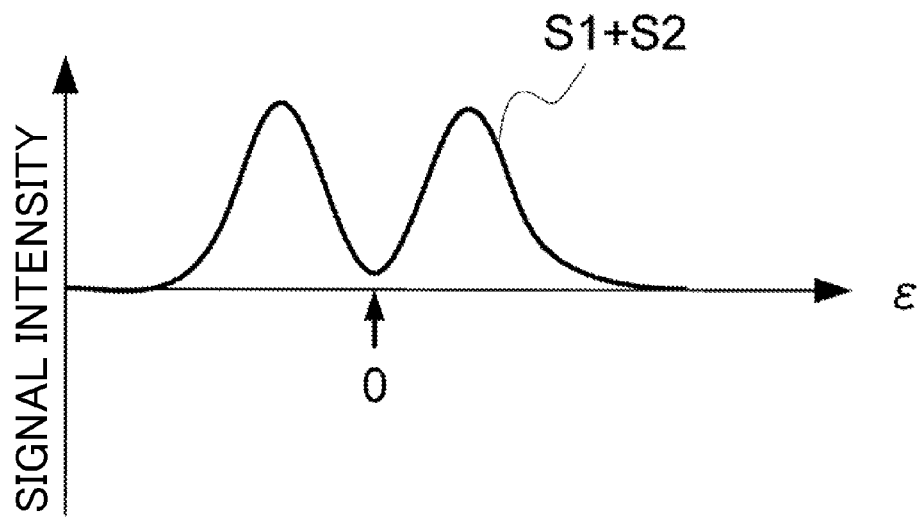
FIG. 9 is a relationship diagram between a signal intensity of a sensor signal (S1+S2) and an angle $\epsilon$.

As described above, when the light enters from one direction, the direction of the incident light can be monitored based on the S-shaped curved signal S1−S2. On the other hand, when the light, like two-beam interference, enters from two directions in the incident planes which are substantially the same, either one of the signals S1 and S2 or, as shown in FIG. 9, a signal S1+S2 which is obtained by adding the signal S2 to the signal S1 is monitored. FIG. 9 is a characteristic diagram showing a relationship between the signal intensity of the signal S1+S2 and the angle ε. The slit can be arranged so that the longitudinal direction of the slit is vertical to the incident plane of the light by controlling the slit or the incident direction of the incident light so as to be an angle ε where the signal S1+S2 shows a valley.

The direction of the image formed by the two-beam interference and the longitudinal direction of the slit can be adjusted in parallel by the measurement and the control as described above. According to the slit scan measurement signal, a high modulation degree can be obtained in a state where the direction of the image and the longitudinal direction of the slit are positioned in parallel.

Thus, the alignment of the slit can be performed with high accuracy and high velocity by aligning the slit and the pattern of the aerial image. Therefore, the aerial image measurement with high velocity and high accuracy can be performed by scanning the slit used for the alignment to obtain the measurement signal. The incident light is not limited to the two light beams, but also in a normal imaging state where the light is constituted by equal to or more than three light beams, the same effect can be obtained when considering the increase of the number of the slit diffracted lights and the spread of the diffracted light corresponding to the incident light angle distribution. At the time of the alignment, the alignment signal is obtained by using partial light of the incident light angle distribution used for the normal imaging, and the longitudinal direction of the slit may be adjusted in parallel to the direction of the aerial image interference pattern obtained by the normal imaging (a direction vertical to the direction in which the aerial image changes).

Figure 10:
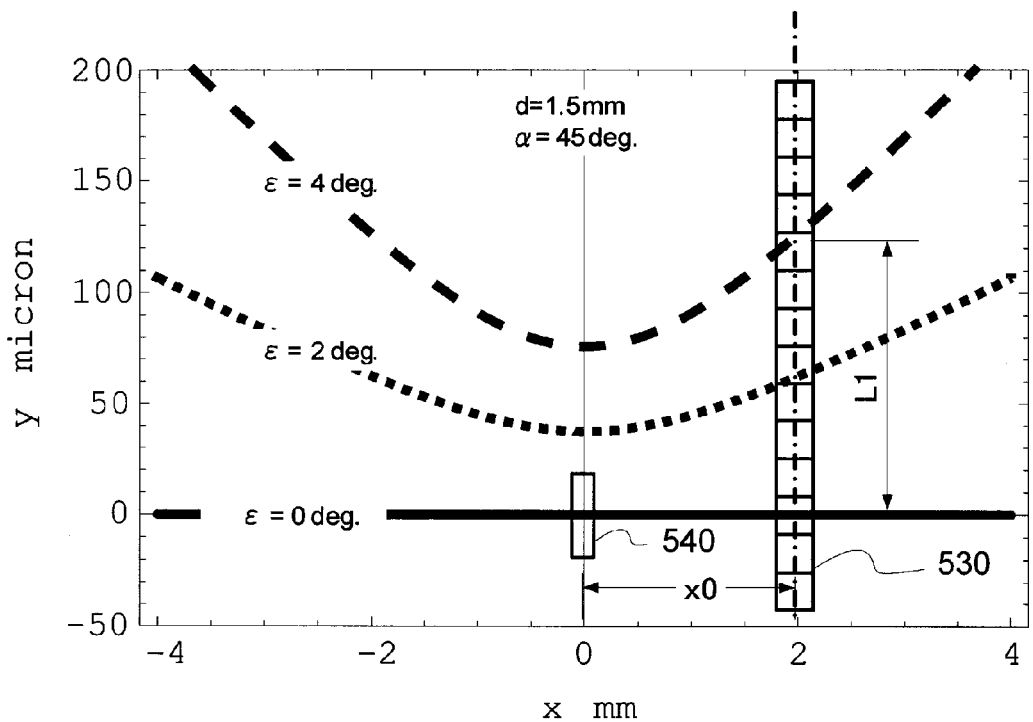
FIG. 10 is a top view of a sensor showing a light intensity distribution measured by a one-dimensional sensor array.

Furthermore, as the light receiving element 53, one-dimensional sensor array which is arranged in line in the longitudinal direction of the slit 540 may be used. FIG. 10 is a distribution diagram of light on the light receiving element plane in the case where the sensor array including a pixel array arranged in one dimension.

FIG. 10 shows a distribution of the light on the light receiving element plane when the angle ε between the incident plane 45 and the direction vertical to the longitudinal direction of the slit 540 is changed, in the case where the distance d between the slit 540 and the light receiving element 53 is 1.5 mm. In the embodiment, the incident angle α of the light based on a normal direction of the light shielding film 51 on which a slit 540 is formed is set to 45°. As shown in FIG. 10, when the angle ε is changed, the position of the hyperbolic curve on the light receiving element plane is changed.

In a coordinate system of FIG. 6, a one-dimensional sensor array 530 which is arranged in line in a longitudinal direction of the slit 540 is distant from the slit 540 in a −Z-axis direction by the distance d=1.5 mm and is distant from the slit 540 in a X-axis direction by X0. When the position (X, Z) of the slit 540 is set to (0, 0), the sensor array 530 is positioned at (X0, −d).

The sensor array 530 detects a peak position of the light intensity in a Y-axis direction at this position. When the angle ε is small, the distance L1 between the X-axis and the peak position of the light intensity increases in proportion to the angle ε. In other words, the distance L1 and the angle ε have a proportional relation.

As described above, the sensor array 530 is distant from the position of the slit 540 by X0. This is because when the sensor array 530 is arranged at a position distant from the slit 540 in the X-axis direction, the angle ε is sensitively detected and the accuracy is improved. However, the embodiment is not limited to this, but the X-coordinate of the sensor array 530 may be the same as that of the slit 540 (X=0).

Figure 11:
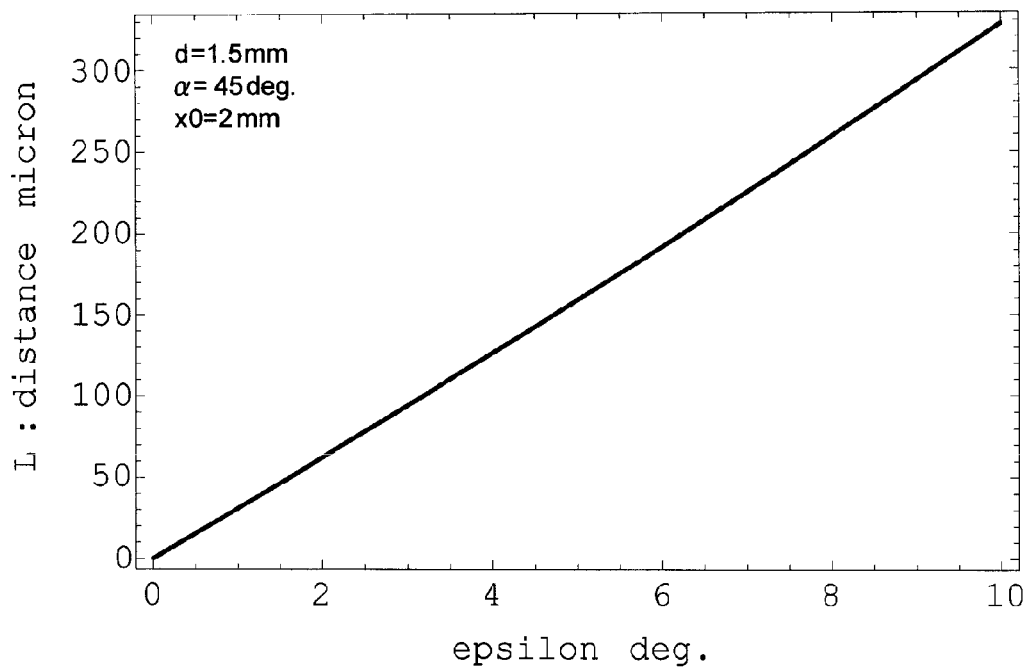
FIG. 11 is a relationship diagram between a distance L1 between an X-axis and a peak position of a light intensity and an angle $\epsilon$.

FIG. 11 is a graph showing a relationship between the distance L1 and the angle ε. FIG. 11 shows the relation in the case where the incident angle α=45°, the distance d=1.5 mm, and the position of the sensor array X0=2 mm.

Although the tilt of the solid line shown in FIG. 11 changes in accordance with the incident angle α and the distance d, it can be instantly calculated by obtaining ε from the distance L1, i.e. ε=L1/a, using a tilt a obtained by the previous measurement or calculation. Even if the incident light is constituted by two light beams or multiple light beams, similar alignment can be performed by detecting peak positions of the light intensity whose number corresponds to the number of the incident light beams. Thus, the alignment of the slit can be performed with high accuracy and high velocity, and further the aerial image measurement can be performed with high velocity and high accuracy.

Figure 20:
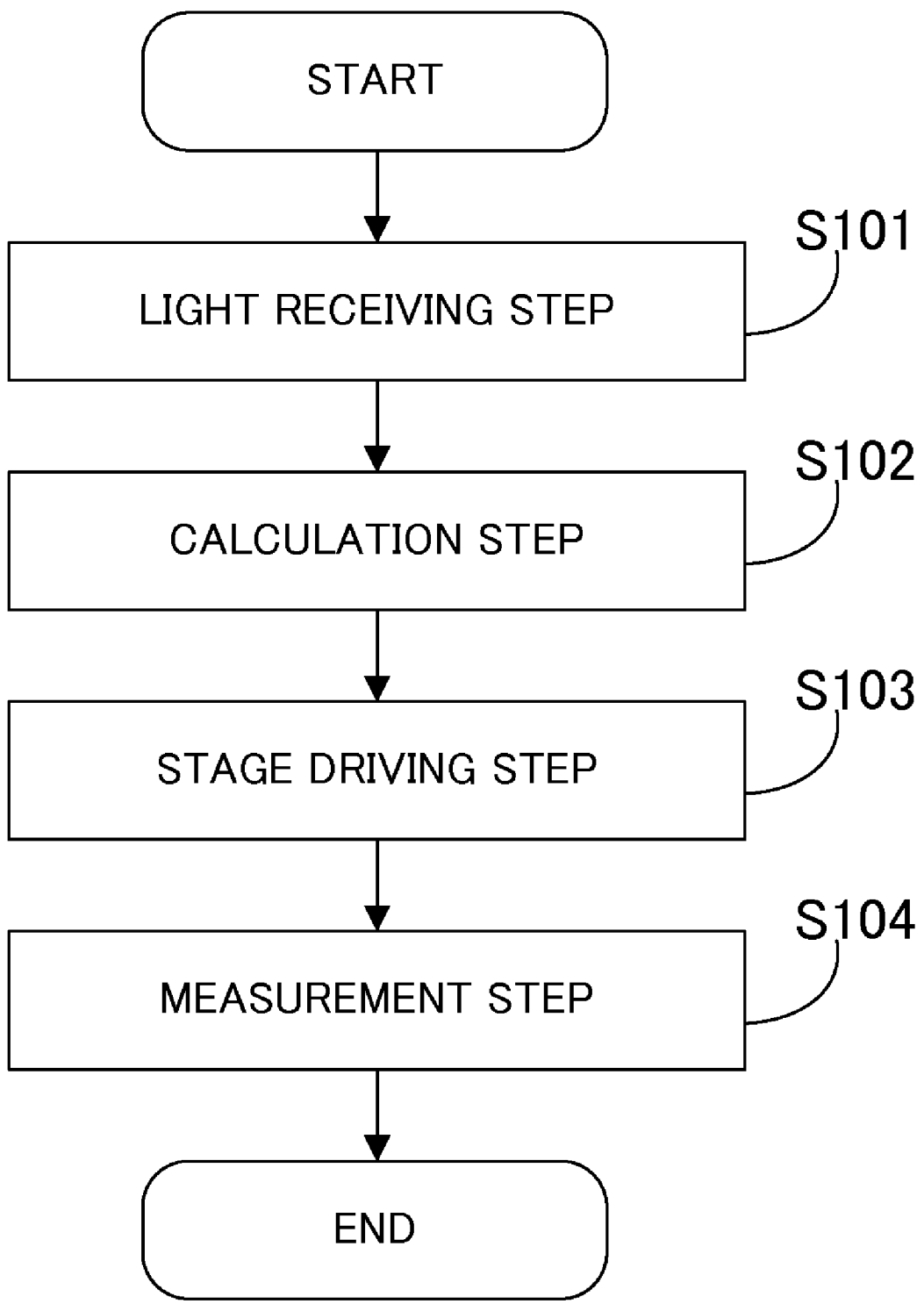
FIG. 20 is a flowchart of a measurement method in the present embodiment.
Figure 21:
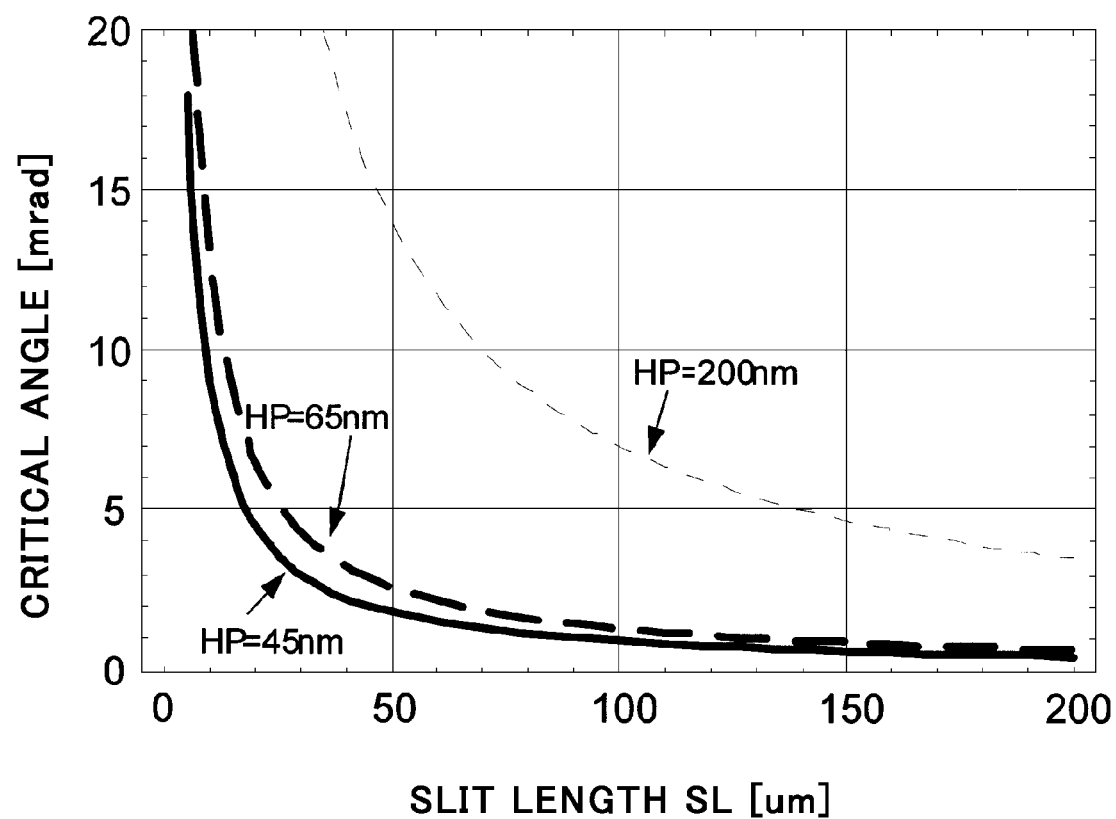
FIG. 21 is a relationship diagram between a critical angle $\theta c$ and a slit length SL.

Next, the measurement method using an alignment process of the present embodiment will be described with reference to the flowchart of FIG. 20.

The measurement method of the present embodiment is a measurement method which illuminates a pattern positioned on an object plane of an optical system to form the aerial image 40 of the pattern on an image plane of the optical system, and measures the light intensity distribution of the aerial image 40 via the slit 540 positioned on the image plane.

First, at light receiving step S101, at least two light receiving portions which is mounted on the stage 60 positioned on the image plane of the optical system receives light which has been transmitted through the slit 540. The at least two light receiving portions, for example, correspond to the first light receiving portion 531 and the second light receiving portion 532 of the light receiving element 53.

Next, at calculation step S102, the angle ε between the direction parallel to the interference pattern of the aerial image 40 and the longitudinal direction of the slit 540 is obtained. The relationship between the angle ε and the distance between a center position of the slit 540 and the position where the light intensity received by the light receiving element 53 is maximum in the longitudinal direction of the slit 540 has been previously stored in a storage unit in the signal processing unit 70. Therefore, the angle ε is obtained based on the relationship between the angle ε stored in the storage unit and the distance. The angle ε is obtained by the calculation unit of the signal processing unit 70.

At stage driving step S103, the stage 60 is rotated so that the angle ε obtained at the calculation step is equal to zero. In this case, the stage driving unit 80 rotates the stage 60 so that the angle ε is equal to zero.

These steps S101 to S103 are an alignment process step. The direction parallel to the interference pattern of the aerial image 40 matches the longitudinal direction of the slit 540 by completing these steps.

After the stage 60 is rotated so that the angle is equal to zero by the alignment process step, the light intensity distribution of the aerial image 40 is measured at the measurement step S104.

According to the above measurement method, because the position relation between the slit and the aerial image can be adjusted with high velocity and high accuracy, the aerial image measurement can be performed with high accuracy.

The light receiving element 53 may include a two-dimensional pixel array such as a CCD or a CMOS image sensor. In this case, in addition to the calculation method of the angle ε described above, an alignment using two-dimensional light intensity distribution on the light receiving element plane can be performed.

Figure 12:
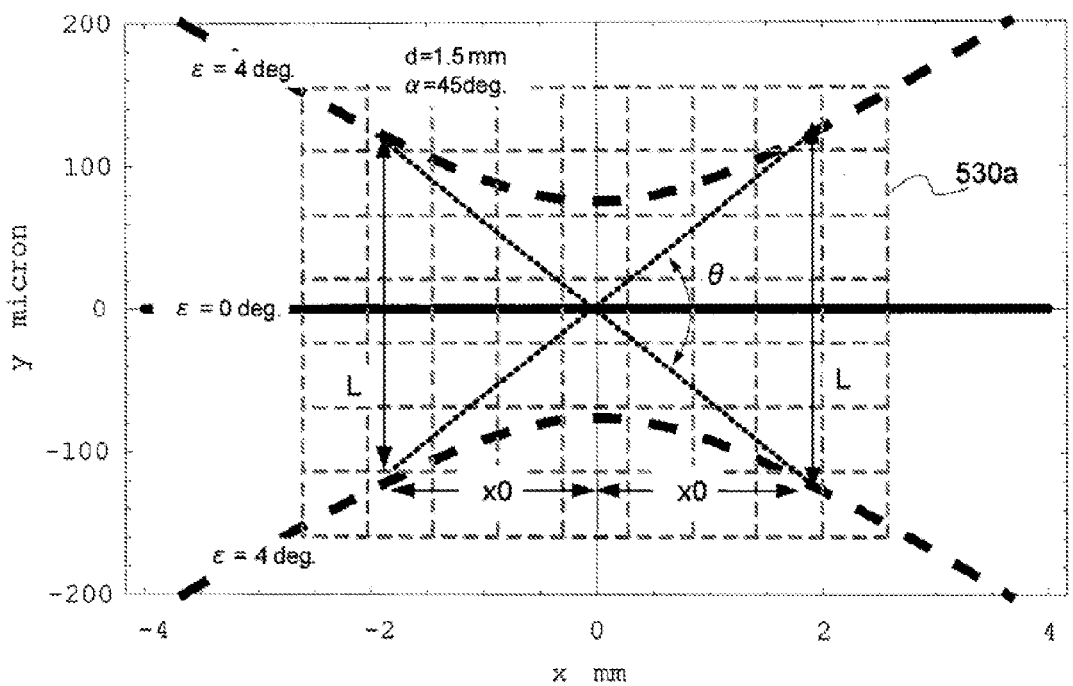
FIG. 12 is a light intensity distribution which is formed on a light receiving element when incident light is constituted by two beams.

FIG. 12 is one example of the light intensity distribution which is formed on the light receiving element plane in the case where the incident light is constituted by two light beams. As shown in FIG. 12, a hyperbolic curved intensity distribution (dashed line) is formed based on the angle ε between the incident plane and the slit vertical direction.

In the embodiment, the light intensity distribution in the Y-axis direction at a position distant from immediately under the sensor of X=0 and Y=0 by a constant distance ±X0 in the X-axis direction is measured by using a two-dimensional sensor array 530a. The light intensity distribution in the Y-axis direction at X=±X0 has an intensity peak at an intersection point of a straight line passing through ±X0 and parallel to the Y-axis and a hyperbolic curve indicated by a dashed line. When the distance in a Y direction of the intensity peak is defined as L, an angle θ can be calculated by using X0 and L. The aerial image and the slit can be aligned by adjusting the directions of the slit and the incident plane so that the calculated angle θ is equal to zero.

FIG. 13 is an image which is obtained by forming an interference pattern by two-beam interference using a light source having a wavelength of 193 nm and by receiving the light which has been transmitted through the slit having a slit width of 120 nm and a slit length of 50 μm by a CCD.

Figure 13A:
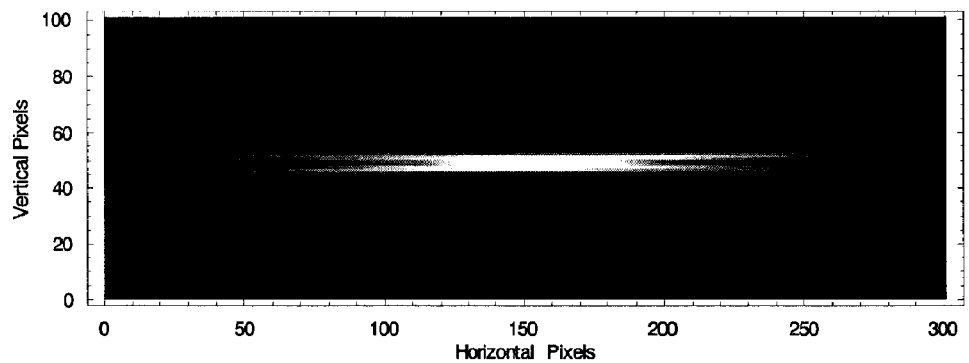
FIGS. 13A to 13C are images obtained by receiving light transmitted through a slit by a CCD.
Figure 13B:
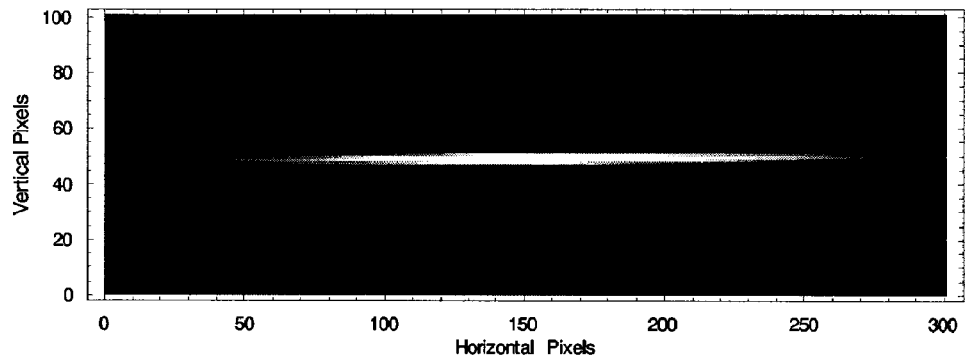
Figure 13C:
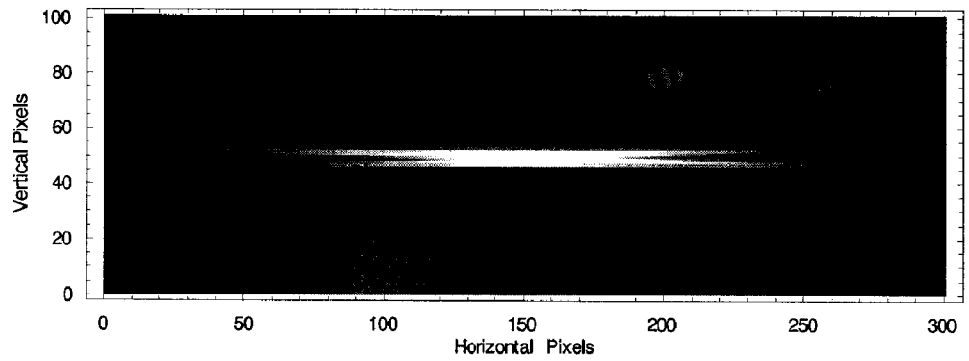

When the angle ε between the slit and the incident plane is −3 degree, two hyperbolic curved intensity distributions as shown in FIG. 13A are obtained. When the slit is rotated by a rotational stage to set the angle ε to zero, a substantially straight line is obtained as shown in FIG. 13B. When the angle ε is further changed to ε=3 degree, as shown in FIG. 13C, two hyperbolic curved intensity distributions similar to those of FIG. 13A are obtained.

Figure 14:
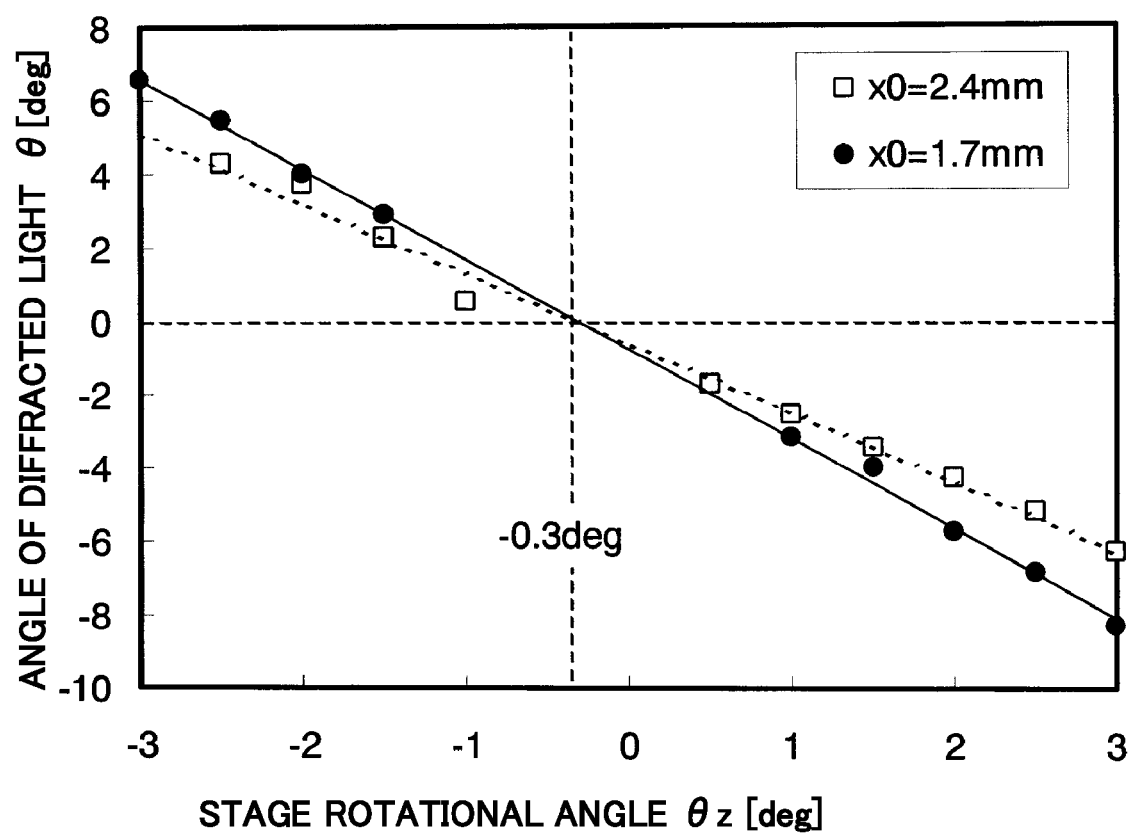
FIG. 14 is a relationship diagram between an angle $\theta$ of FIG. 12 and a rotational angle $\theta z$.

In the embodiment, the light intensity distribution in the Y-axis direction is detected in a hyperbolic curved intensity distribution at positions where the distance X0 from the Y-axis is 1.7 mm and 2.4 mm, and the angle θ shown in FIG. 12 is obtained by using the distance L between the intensity distribution peaks. FIG. 14 shows the result which is obtained by rotating the stage 60 mounting the sensor by the stage driving unit 80 and by the experiment how the angle θ changes with respect to the stage rotational angle θz. The cases where the distance X0 is 1.7 mm and the distance X0 is 2.4 mm are indicated by a solid line and a dashed line, respectively.

As shown in FIG. 14, when the stage rotational angle θz is set to −0.3 degree, the angle θ is equal to zero. At this time, the direction of the interference pattern of the two light beams is arranged in parallel to the longitudinal direction of the slit. The alignment of the slit can be performed with high accuracy and high velocity and further the aerial image measurement can be performed with high velocity and high accuracy by using the alignment method.

Figure 15A:
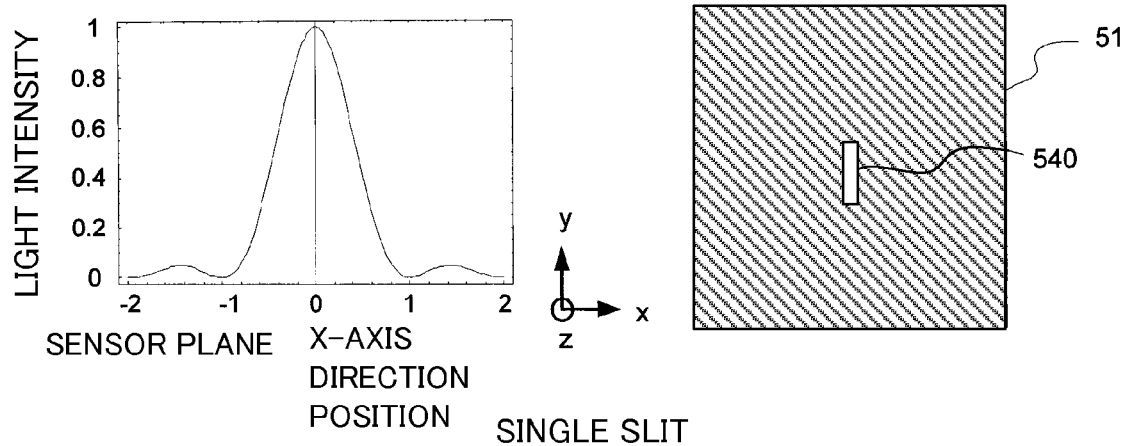
FIG. 15A is a diagram of a light intensity distribution which is detected when a single slit is used.
Figure 15B:
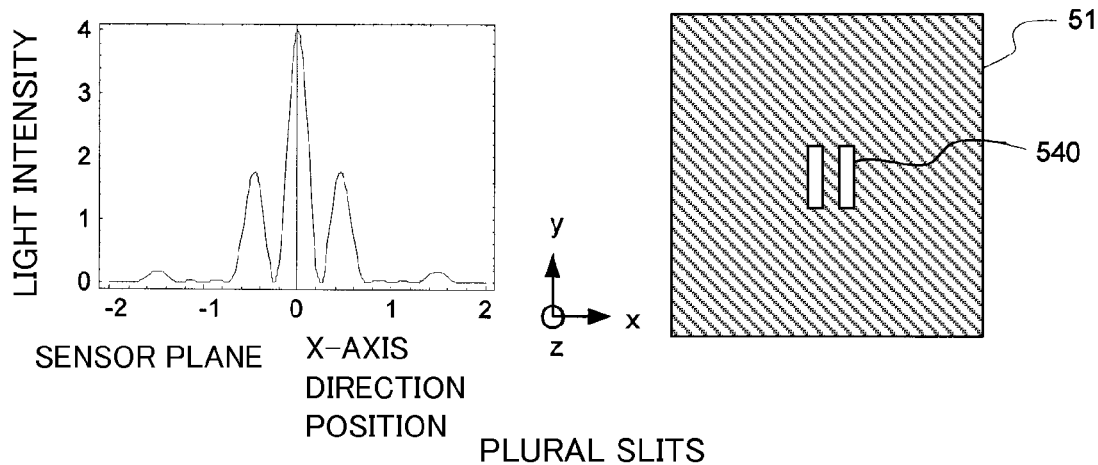
FIG. 15B is a diagram of a light intensity distribution which is detected when a plurality of slits are used.

The slit 540 for alignment is not limited to the single slit, but it may be constituted by a plurality of slits. FIGS. 15A and 15B compare light intensity distributions which are detected by a single slit and a plurality of slits. FIG. 15A shows the light intensity distribution which is detected when the single slit is used. FIG. 15B shows the light intensity distribution which is detected when the plurality of slits are used.

As shown FIG. 15B, when the plurality of slits 540 are provided, the intensity distribution of the transmitted light from the slit 540 has a plurality of peaks in accordance with slit intervals. Therefore, compared to the case where the single slit is used as shown in FIG. 15A, the peak intensity increases. For example, when the single slit is used, as shown in FIG. 15A, the maximum light intensity is equal to 1. On the other hand, in the case where two slits are used as shown in FIG. 15B, the maximum light intensity is 4, and thus, the light intensity which is four times as much as that in the case where the single slit is used can be obtained.

Therefore, if the plurality of slits are used, because the photo-electrically converted light intensity increases and the signal intensity increases, the signal to noise ratio can be improved. If the pattern of the aerial image is periodic, the slits are also used for the measurement by arranging the slits at a position which is integral multiple of the period of the aerial image. As described above, the error of the slit scan signal caused by the electric noise or the stage vibration can be reduced and a highly reproducible measurement apparatus of an aerial image can be provided.

Figure 16:
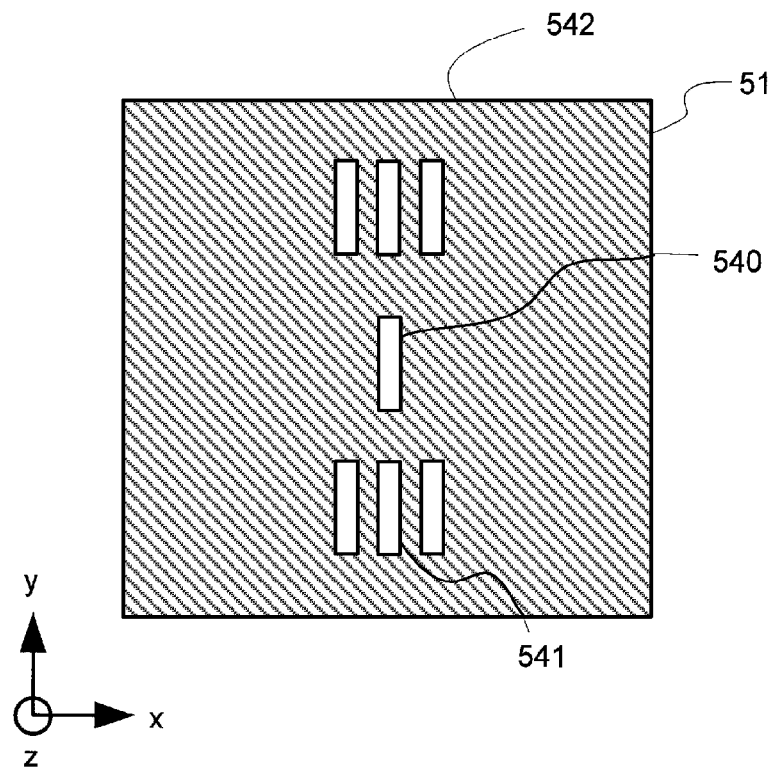
FIG. 16 is a top view of a sensor in which a slit for measuring an aerial image and a silt for alignment are provided.

The slit for alignment is not limited to the same one for measuring the actual aerial image, but a slit for alignment other than the slit for measuring the aerial image may also be provided. FIG. 16 is a top view of a sensor in which a slit for alignment other than a slit for measuring the aerial image is provided.

As shown in FIG. 16, at a position which is different from that of the slit 540 for measurement, a first alignment slit 541 and a second alignment slit 542 are positioned. In this case, the slit 540 for measurement is not limited to the slit shape, but for example an opening having a pinhole shape can also be used. When the opening having the pinhole shape is used as the slit 540 for measurement, an aerial image having a two-dimensional pattern other than that having a one-dimensional pattern can also be measured by the two-dimensional scanning of the opening.

Figure 17:
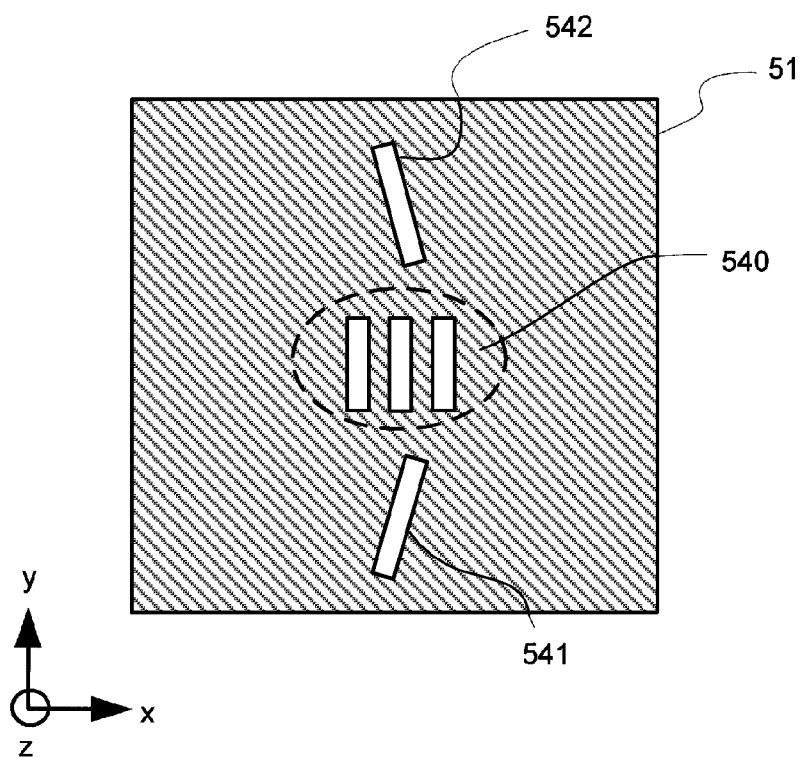
FIG. 17 is a top view of a sensor in which a plurality of slits for alignment are arranged at different angles from each other.

FIG. 17 is a top view of the sensor which has a plurality of slits for alignment positioned at an angle differing from each other. As shown in FIG. 17, the first alignment slit 541 and the second alignment slit 542 are positioned at a differing angle from each other. According to the configuration, an alignment angle can be calculated a once by using a distribution of the diffracted light from the first alignment slit 541 and the second alignment slit 542. Therefore, the alignment can be performed with high velocity and the measurement throughput can be improved.

Figure 18:
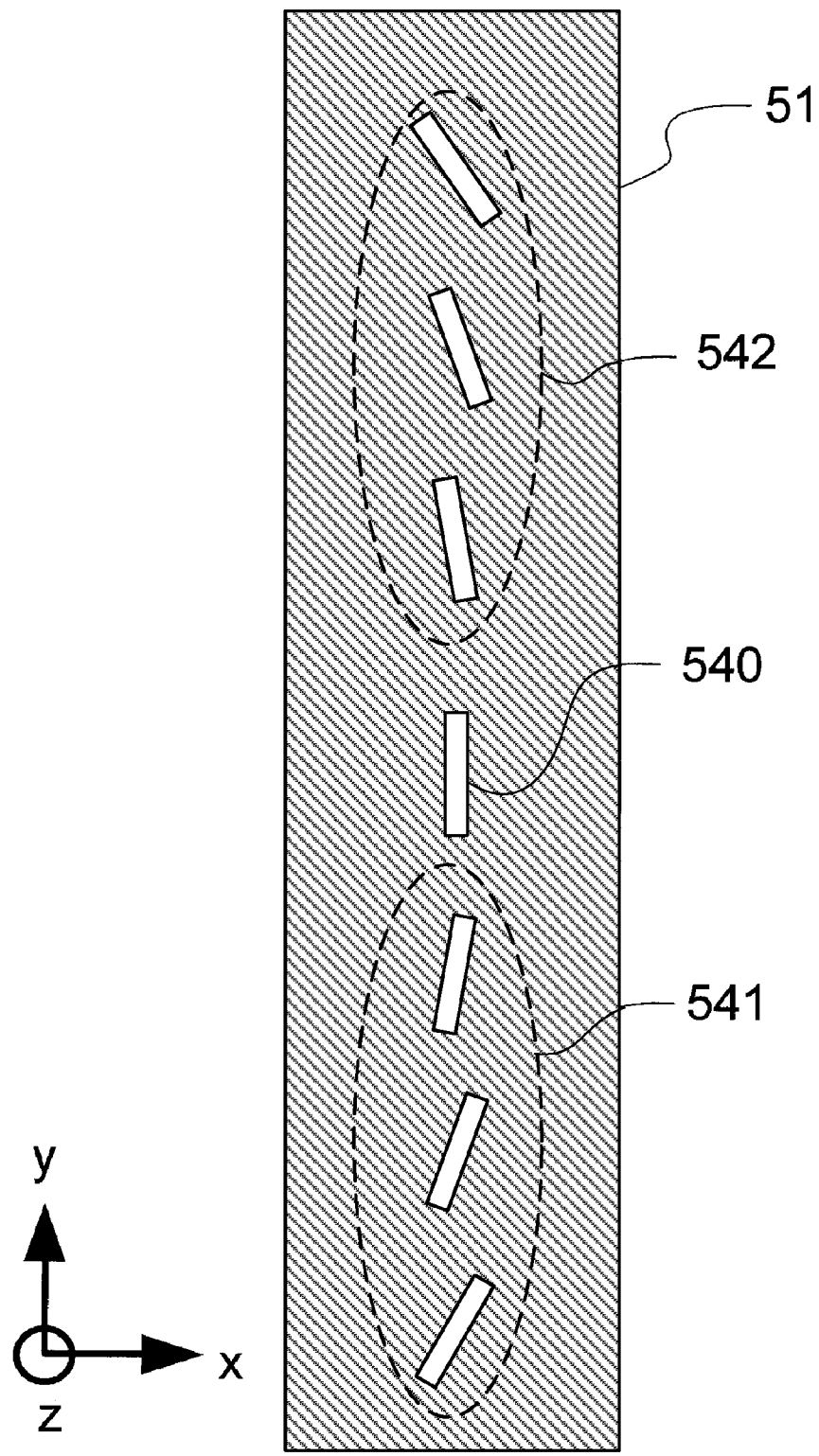
FIG. 18 is a top view of a sensor in which slits for alignment are arranged at a plurality of different angles from a slit for measurement.

Furthermore, as shown in FIG. 18, alignment slits can be arranged at a plurality of angles differing from the measurement slit. FIG. 18 is a top view of a sensor in which the slits for alignment are arranged at a plurality of angles differing from the slit for measurement.

As shown in FIG. 18, the first alignment slit 541 has a plurality of slits which are arranged at angles differing from one another with respect to the slit 540 for measurement. Similarly, the second alignment slit 542 also has a plurality of slits which are arranged at angles differing from one another with respect to the slit 540 for measurement.

The angles of these alignment slits have been previously stored in the storage unit and the alignment signal may be obtained in accordance with the alignment slit previously stored. In this case, even if the slit for measurement is substantially parallel to the pattern of the aerial image, an aerial image measurement can be performed with high accuracy because the alignment slit can obtain an alignment signal whose sensitivity is high.

Figure 19A:
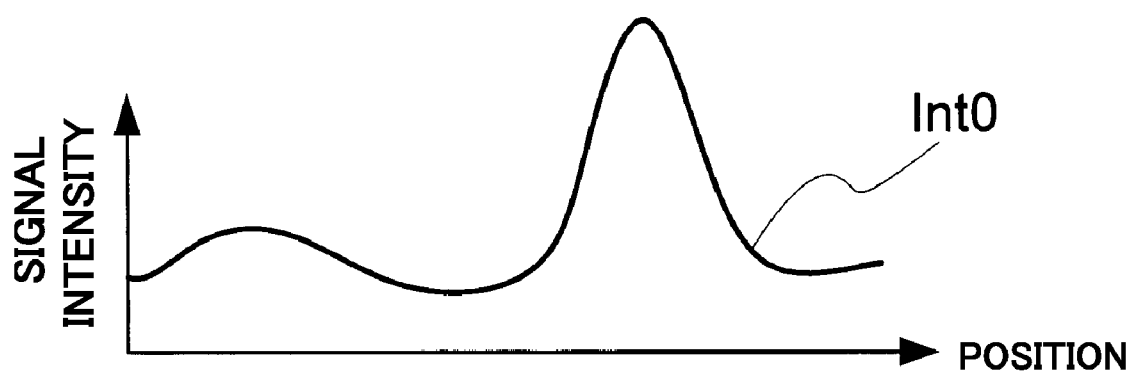
FIGS. 19A and 19B are views of a generalized slit scan signal.
Figure 19B:
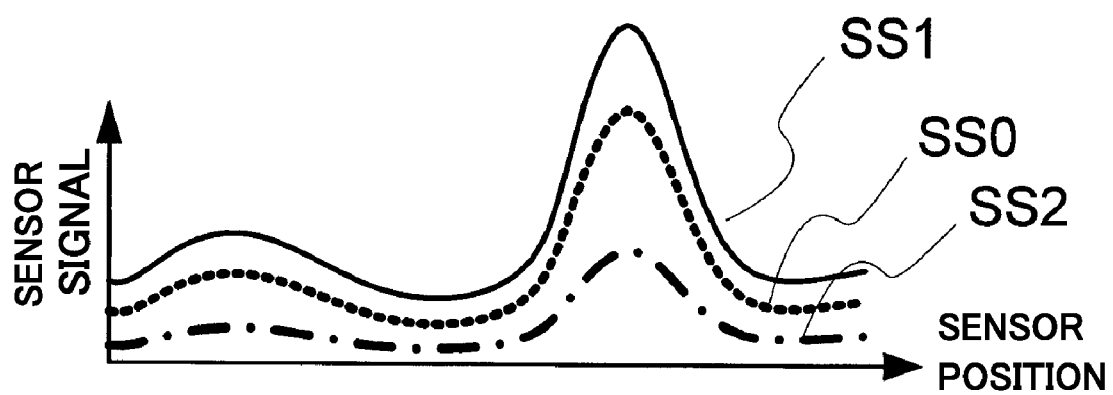

FIGS. 19A and 19B are views of a generalized slit scan signal. FIG. 19A is a cross-sectional view of an aerial image intensity distribution having a striped shape which is formed by the optical system, and the relationship between the signal intensity and the position changes indicated by Int0. FIG. 19B shows the relationship between the sensor signal and the sensor position. When the alignment of the slit and the aerial image is not performed, the slit scan signal to be outputted is, as indicated by SS2, a signal whose modulation degree is rather reduced compared to the original aerial image. However, if the alignment of the aerial image and the slit is performed by using the measurement method of the present embodiment, a signal having a high modulation degree like SS0 can be obtained.

However, because the slit scan signal is detected as a signal which has been transmitted through the slit formed on the light shielding film having a limited thickness, the signal shows a convolution of the actual aerial image intensity distribution and the slit transmission characteristics. A signal SS1 which is close to the actual aerial image can be measured by referring to slit transmission characteristics previously stored or by calculating the slit transmission characteristics by a computer to perform a recovery process such as a deconvolution. According to the above method, an aerial image measurement method which does not depend upon a slit shape can be provided with high accuracy.

A slit scan signal SS2 whose modulation degree is reduced can also be recovered from the slit scan image to the signal SS0 which is close to the actual aerial image by measuring the alignment error amount of the slit and the aerial image. In this case, the stage driving direction corresponding to the measured alignment error and the slit transmission characteristics if the alignment error is generated have been previously obtained, or after calculating them by a computer, a recovery process such as a deconvolution may be performed. Using this method, the time used for driving the stage and performing the alignment of the slit and the aerial image can be omitted, and the aerial image can be obtained by one slit scan measurement. Therefore, a measurement method with higher velocity can be provided.

When the recovery process is performed, the accuracy of the recovery process can be improved by previously obtaining the wavelength width of the light source, the polarization degree, the aberration of the optical system, and the like, or by referring to the measured value obtained by using other sensors from the optical system.

Since the measurement apparatus which performs the measurement method of the present embodiment is capable of measuring the aerial image with high velocity and high accuracy, the optical system can be evaluated with high accuracy by mounting the sensor on the stage of a semiconductor exposure apparatus or the like. Therefore, the manufacturing cost of the semiconductor exposure apparatus can be reduced and the imaging performance can be improved. However, the sensor in the measurement apparatus of the present embodiment is not limited to the configuration where the sensor is mounted on a stage, but it may be mounted on a place inside the semiconductor exposure apparatus other than the stage. Furthermore, the sensor does not have to be installed in the exposure apparatus, and the measurement apparatus of the present embodiment is configured to be provisionally installed at a position corresponding to a wafer plane and to be detached after completing the measurement.

A device (a semiconductor integrated circuit device, a liquid crystal display device, or the like) is manufactured by a process of exposing a substrate (a wafer, a glass plate, or the like) coated by a photosensitizing agent using the exposure apparatus of one of the above embodiments, a process of developing the substrate, and other well-known processes.

According to the above embodiment, a measurement apparatus and a measurement method which adjust the position relation between a slit and an aerial image with high velocity and high accuracy can be provided. Therefore, a slit scan signal with high modulation degree can be obtained, the aerial image measurement can be performed with high accuracy, and the optical system can be evaluated with high accuracy. Furthermore, according to the above embodiment, an exposure apparatus including the measurement apparatus and a device manufacturing method using the exposure apparatus can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, the present invention may perform both of the alignment process described in the above embodiment and the process for adjusting the alignment by scanning the slit during changing the angle of the slit so that the modulation degree of the scan signal is the highest. In this case, after the angle $\epsilon$ is obtained with high velocity by performing the alignment process in the above embodiment, the adjustment is performed so that the modulation degree of the scan signal is heightened while the angle of the slit is changed. According to the configuration, the angle with higher accuracy can be obtained with high velocity.

This application claims the benefit of Japanese Patent Application No. 2008-119672, filed on May 1, 2008, which is hereby incorporated by reference herein in its entirety.

What is claimed is:

1. A measurement apparatus configured to illuminate a pattern positioned on an object plane of an optical system to form an image of the pattern on an image plane of the optical system and measure a light intensity distribution of the image via a slit positioned on the image plane, the measurement apparatus comprising:
   a stage configured to move the slit;
   a light receiving element which is mounted on the stage and includes at least two light receiving portions which receive light that has been transmitted through the slit;
   a storage unit configured to store a relationship between an angle between a direction parallel to an interference pattern of the image and a longitudinal direction of the slit and a distance in the longitudinal direction of the slit between a center position of the slit and a position where an intensity of light that the light receiving element receives is maximum;
   a calculation unit configured to obtain the angle using detection result detected by the light receiving element and the relationship stored in the storage unit; and
   a stage driving unit configured to rotate the stage so that the angle is equal to zero, using the angle calculated by the calculation unit.

2. A measurement apparatus according to claim 1, wherein the light receiving element includes a pixel array which is arranged in one dimension.

3. A measurement apparatus according to claim 1, wherein the light receiving element includes a pixel array which is arranged in two dimensions.

4. A measurement apparatus according to claim 1, wherein the slit includes a plurality of slits.

5. A measurement apparatus according to claim 1, wherein the slit includes a slit for alignment and a slit for measurement.

6. A measurement apparatus according to claim 5, wherein the slit for alignment includes a plurality of slits which are arranged at angles differing from one another.

7. A measurement apparatus according to claim 1, wherein the calculation unit calculates a slit scan signal using transmission characteristics of the slit which have been previously stored or are calculated by a computer.

8. A measurement method for illuminating a pattern positioned on an object plane of an optical system to form an image of the pattern on an image plane of the optical system and measuring a light intensity distribution of the image via a slit positioned on the image plane, the measurement method comprising:
   a light receiving step of receiving light that has been transmitted through the slit by using a light receiving element including at least two light receiving portions which are mounted on a stage configured to move the slit;
   a calculation step of obtaining an angle using detection result detected by the light receiving element and a relationship between an angle between a direction parallel to an interference pattern of the image and a longitudinal direction of the slit and a distance in the longitudinal direction of the slit between a center position of the slit and a position where an intensity of light that the light receiving element receives is maximum;
   a stage driving step of rotating the stage so that the angle is equal to zero, using the angle calculated in the calculation step; and
   a measurement step of measuring the light intensity distribution of the image after rotating the stage so that the angle is equal to zero.

9. An exposure apparatus comprising:
   a measurement apparatus according to claim 1,
   wherein the exposure apparatus exposes a pattern of a mask onto a substrate based on a measurement result of the measurement apparatus.

10. A device manufacturing method comprising the steps of:
    exposing a substrate using an exposure apparatus; and
    developing the exposed substrate,
    wherein the exposure apparatus includes a measurement apparatus configured to illuminate a pattern positioned on an object plane of an optical system to form an image of the pattern on an image plane of the optical system and measure a light intensity distribution of the image via a slit positioned on the image plane, the measurement apparatus comprising:
    a stage configured to move the slit;
    a light receiving element which is mounted on the stage and includes at least two light receiving portions which receive light that has been transmitted through the slit;
    a storage unit configured to store a relationship between an angle between a direction parallel to an interference pattern of the image and a longitudinal direction of the slit and a distance in the longitudinal direction of the slit between a center position of the slit and a position where an intensity of light that the light receiving element receives is maximum;
    a calculation unit configured to obtain the angle using detection result detected by the light receiving element and the relationship stored in the storage unit; and
    a stage driving unit configured to rotate the stage so that the angle is equal to zero, using the angle calculated by the calculation unit.

* * * * *